United States Patent [19]

Voyce

[11] Patent Number: 5,049,838
[45] Date of Patent: Sep. 17, 1991

[54] MINIMUM INTRUSION SEARCH OSCILLATOR FOR USE IN FEEDBACK LOOPS

[75] Inventor: Kenneth G. Voyce, Bellevue, Wash.
[73] Assignee: The Boeing Company, Seattle, Wash.
[21] Appl. No.: 409,458
[22] Filed: Sep. 19, 1989
[51] Int. Cl.$^5$ ............................................. H03L 7/00
[52] U.S. Cl. ..................................... 331/11; 331/16; 331/25; 331/175; 331/DIG. 2
[58] Field of Search ....................... 331/11, 14, 16, 17, 331/25, DIG. 2, 175, 177 R, 186, 34

[56] References Cited

U.S. PATENT DOCUMENTS

| | | |
|---|---|---|
| 3,231,728 | 1/1966 | Kusto. |
| 3,553,566 | 3/1968 | Nagy, Jr. |
| 3,579,150 | 5/1971 | Badessa. |
| 3,648,071 | 3/1972 | Mrazek. |
| 3,743,957 | 7/1973 | Feistel. |
| 3,918,005 | 11/1975 | Bruckenstein et al. |
| 4,510,461 | 4/1985 | Dickes et al. ............ 331/DIG. 2 X |
| 4,617,527 | 10/1986 | Naitoh ....................... 331/DIG. 2 X |

FOREIGN PATENT DOCUMENTS

| | | |
|---|---|---|
| 2550998 | 5/1977 | Fed. Rep. of Germany. |
| 0072541 | 6/1981 | Japan .......................... 331/DIG. 2 |
| 1003190 | 9/1965 | United Kingdom. |

Primary Examiner—Robert J. Pascal
Attorney, Agent, or Firm—Christensen, O'Connor, Johnson & Kindness

[57] ABSTRACT

A search oscillator (12) is disclosed for use with a closed-loop system (10) to sense when the system is out of lock and enhance the system's pull-in capabilities. The oscillator includes a loop filter (22) and a sensing circuit (24), composed of a positive limit sensor (26) and negative limit sensor (28). When the system is out of lock, the output $V_{out}$ of the oscillator slews positive or negative in an effort to restore the system to lock. The positive and negative limit sensors monitor the output and reset it when predetermined thresholds are reached, allowing the search or sweep operation to continue until lock is achieved.

12 Claims, 5 Drawing Sheets

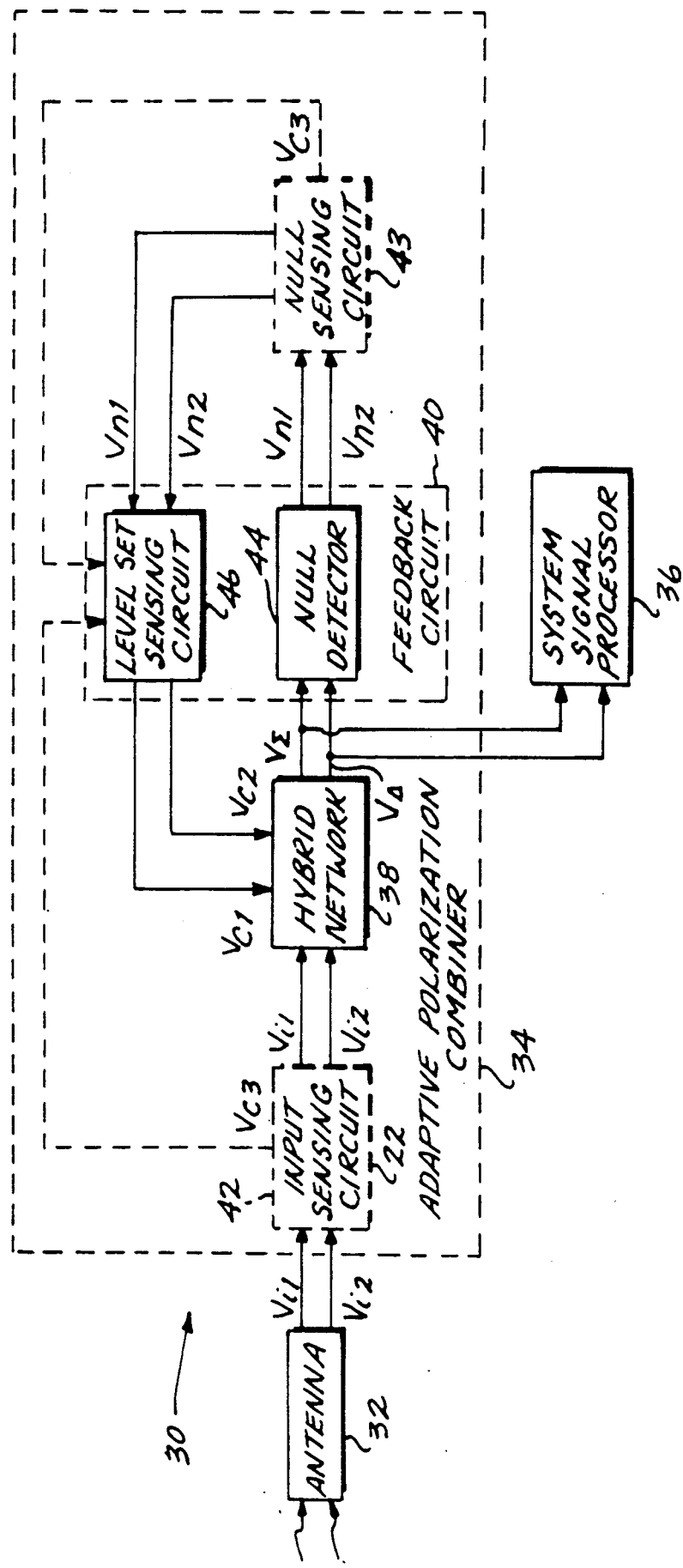

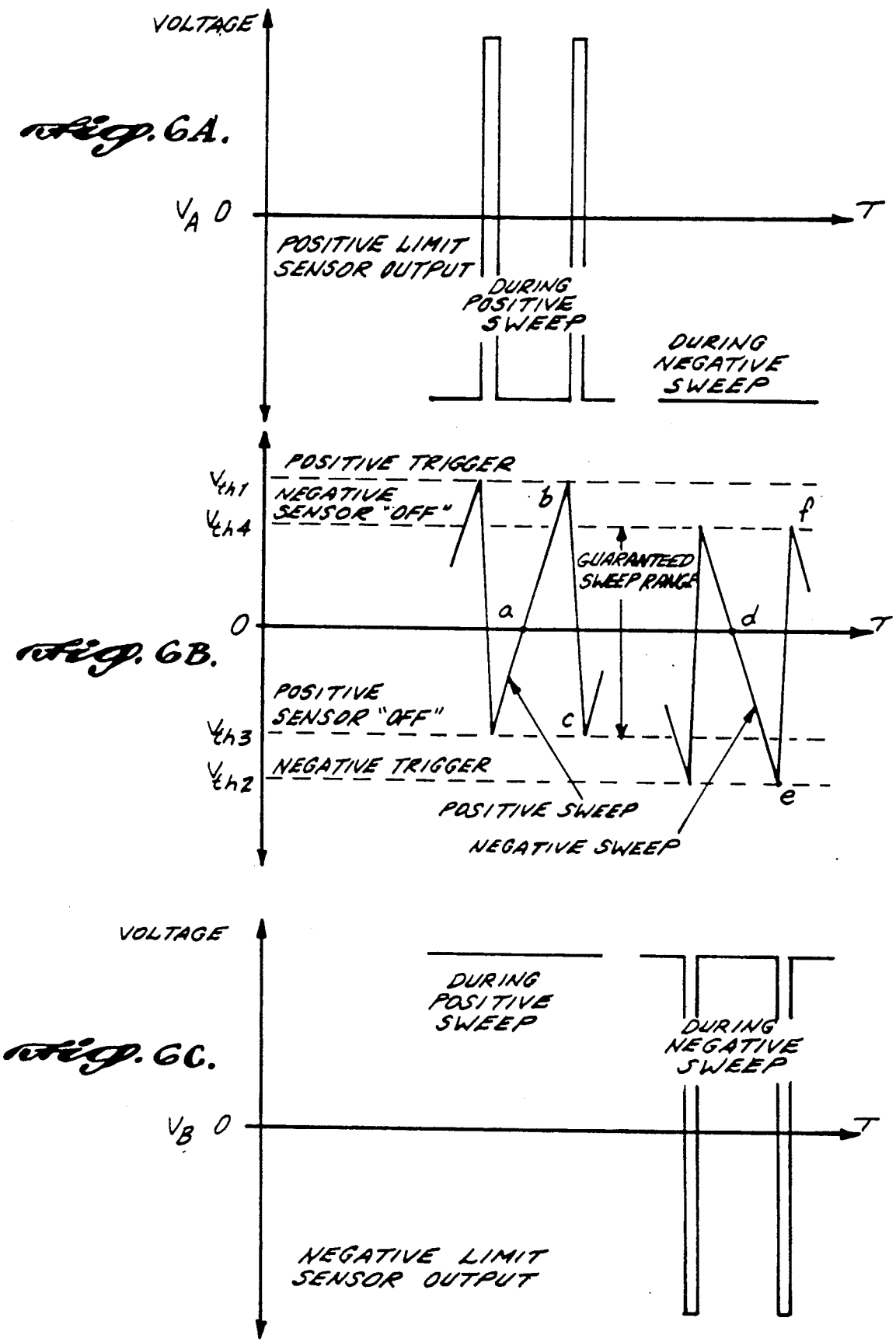

MINIMUM INTRUSION SEARCH OSCILLATOR FOR USE IN FEEDBACK LOOPS

FIELD OF THE INVENTION

This invention relates generally to feedback loops and, more particularly, to search oscillators for use in such loops.

BACKGROUND OF THE INVENTION

Closed-loop systems are employed in a wide variety of applications to maintain an output at some desired value. The output is produced by a forward section of the system in response to a system input. To prevent changes in the system input from causing undesired deviations in the system output, a feedback section is employed. More particularly, the feedback section monitors the system output and produces a feedback signal that is combined with the system input to adjust the operation of the forward circuit and restore the system output to the desired condition.

Once the output signal of the closed-loop system is at the desired condition, the effect that minor deviations of the input signal have on the output signal can be easily sensed and the input signal corrected accordingly. In this situation, the system is able to maintain the desired output signal and in applications including polarization combination and phase locking the system is said to be in a state of "lock." If the input signal changes more drastically, however, the feedback section may be unable to make the corrections necessary to immediately restore the output signal to the desired level. In this condition, the system is said to be "out-of-lock" and the process of restoring the system to lock is known as "pull-in." When the input signal temporarily disappears, or when the system is first activated, the difference between the output signal produced and the desired output signal may be so great that the system is unable to pull-in, or adjust the input signal adequately to restore proper operation.

In such situations, it is necessary to sense the out-of-lock condition and provide some mechanism for bringing the system back into lock. This can be accomplished, for example, by causing the feedback signal to sweep through a range of values until the input signal is adjusted to a level at which the desired output signal is produced, and lock achieved. Then, with the system locked, this sweep or search function is disabled and standard closed-loop operation of the system resumes.

The enhancement of the system's pull-in capability, however, should not detract from other system characteristics. For example, unduly complex circuitry should not be required to perform the lock sensing or search operations. In addition, system performance should not be degraded via decreased loop sensitivity or noise immunity.

One prior art implementation of a search oscillator used to enhance the pull-in characteristics of a closed-loop system is shown in FIG. 1. The oscillator includes a first operational amplifier $U_1$ having its inverting input coupled to an input signal $V_{in}$ by a resistor $R_1$, and its noninverting input coupled to ground. The inverting input is also connected to a negative supply by a resistor $R_2$. The output terminal of operational amplifier $U_1$ provides an output signal $V_{out}$. A capacitor $C_1$ is connected between the inverting input and the output of operational amplifier $U_1$.

The oscillator also includes a second operational amplifier $U_2$, diode $D_1$, and resistors $R_3$ and $R_4$ connected between the inverting input and the output of amplifier $U_1$ in the following manner. The noninverting input of amplifier $U_2$ is connected to the output of amplifier $U_1$ by resistor $R_3$. The inverting input of amplifier $U_2$ is connected to ground. The output of amplifier $U_2$ is connected to the positive side of diode $D_1$, while the negative side of diode $D_1$ is coupled to the inverting input of amplifier $U_1$. Resistor $R_4$ is connected between the noninverting input and output of amplifier $U_2$.

Discussing now the operation of the search oscillator shown in FIG. 1, as will be appreciated, amplifier $U_1$ is employed as an integrator and amplifier $U_2$ is employed as a comparator. Together, they sense the out-of-lock condition of the closed-loop system and initiate sweeping of, for example, a system feedback signal to accomplish pull-in. A key feature of the oscillator is its use of the negative supply and resistor $R_2$ to produce an offset current $I_{offset}$. To illustrate the manner in which this offset current allows the oscillator to sense the out-of-lock condition and initiate sweeping, an example is provided.

Consider the situation in which the input voltage $V_{in}$ is absent. As will be appreciated, the current flowing through capacitor $C_1$ is equal to the offset current $I_{offset}$ in this situation. Because the current flowing through a capacitor is proportional to the rate of the change of the voltage across the capacitor, the offset current $I_{offset}$ thus determines both the rate and direction of the change in the output $V_{out}$ of amplifier $U_1$. As a result, in the arrangement shown, $V_{out}$ will rise slowly, sweeping across all required lock conditions.

The output $V_{out}$ of amplifier $U_1$ is, in turn, applied to the noninverting input of amplifier $U_2$. As will be appreciated, before $V_{out}$ began to rise, the low level signal applied to the noninverting input of amplifier $U_2$ would have maintained $U_2$ OFF and its output $V_1$ low. As $V_{out}$ rises, however, the voltage applied to the noninverting input of $U_2$ will also rise. This voltage, which is set by the voltage divider formed by resistors $R_3$ and $R_4$ between the low voltage $V_1$ and the rising voltage $V_{out}$, will at some point exceed the ground level applied to the inverting input of amplifier $U_2$.

At this point, $V_{out}$ is at a first threshold level $V_a$ and amplifier $U_2$ will switch ON, forward-biasing diode $D_1$. As the charge on capacitor $C_2$ increases, the current output by amplifier $U_2$ will become adequate to overcome the offset current $I_{offset}$. As a result, the output of amplifier $U_1$ will drop low, along a line whose slope and direction are a function of the current output by amplifier $U_2$ in excess of the offset current $I_{offset}$.

As $V_{out}$ falls, the voltage divider formed by resistors $R_s$ and $R_f$ between the falling output $V_{out}$ and the high output $V_1$ of amplifier $U_2$ will eventually cause the voltage applied to the noninverting input of amplifier $U_2$ to fall back below the ground level applied to the inverting input. At this point $V_{out}$ is at a second threshold $V_b$. The cycle is then ready to repeat.

In this manner, the oscillator effectively detects the out-of-lock condition and causes the output $V_{out}$ of amplifier $U_1$ to be swept through a signal range between the thresholds $V_a$ and $V_b$ of comparator $U_2$. This range is roughly centered about ground.

The sweep function of the search oscillator shown in FIG. 1 is disabled in the following manner. For example, assume the circuit is locked on an incoming signal $V_{in}$, having a magnitude that is sufficient to overcome the offset current $I_{offset}$. In this situation, amplifier $U_1$ functions as an integrator and compensates the feedback loop for stability. Because the output $V_{out}$ of amplifier $U_1$ is no longer sweeping in response to the constant current $I_{offset}$, comparator $U_2$ is kept OFF and diode $D_1$ back-biased. As a result, the sweep function is effectively disabled.

The search oscillator shown in FIG. 1 has the advantage of requiring only one limit-sensing amplifier $U_2$ because the offset current $I_{offset}$ is greater than any inherent offset for amplifier $U_1$, ensuring that the sweep will always occur with one polarity, e.g., negative-to-positive. As a result, only one sensor, having a positive trigger threshold, is required. This search oscillator is, however, able to lock onto only signals large enough to overcome the offset current $I_{offset}$ and hence disable the sweep function. In other words, the offset current $I_{offset}$ degrades the sensitivity of the feedback loop. In addition, because the loop must overcome the offset current $I_{offset}$, noise is more likely to cause the oscillator to fall out-of-lock.

In addition to the search oscillator shown in FIG. 1, other prior art arrangements have been developed. For example, some search schemes involve the use of detectors that sense the magnitude of the loop error. These schemes also degrade loop sensitivity due to the detector thresholds. In addition, more complicated lock-sensing schemes have been devised, including circuits employing phase lock loops with extra phase detectors.

In view of the preceding remarks, it would be desirable to produce a search oscillator that is capable of sensing when the system is out-of-lock and enhancing the system's pull-in capability, without undue complexity and without degrading loop sensitivity or the noise immunity of the system.

SUMMARY OF THE INVENTION

In accordance with this invention, a search oscillator is disclosed for receiving an input signal and producing an output signal. The search oscillator includes a filter for filtering the input signal to produce the output signal. The oscillator also includes a positive limit-sensing circuit for monitoring the output signal and providing a first output to the filter to adjust the output signal to a first reset level if the output signal rises above some first threshold level. A negative limit-sensing circuit is included to monitor the output signal and provide a second output to the filter to adjust the output signal to a second reset level if the output signal falls below some second threshold level.

BRIEF DESCRIPTION OF THE DRAWINGS

The invention will presently be described in greater detail, by way of example, with reference to the accompanying drawings, wherein:

FIG. 4 is a block diagram of a polarization diversity system including the search oscillator of FIG. 3;

FIGS. 6A, 6B, and 6C are graphic representations of the operation of the oscillator shown in FIG. 5.

DETAILED DESCRIPTION OF THE INVENTION

Figure 1:
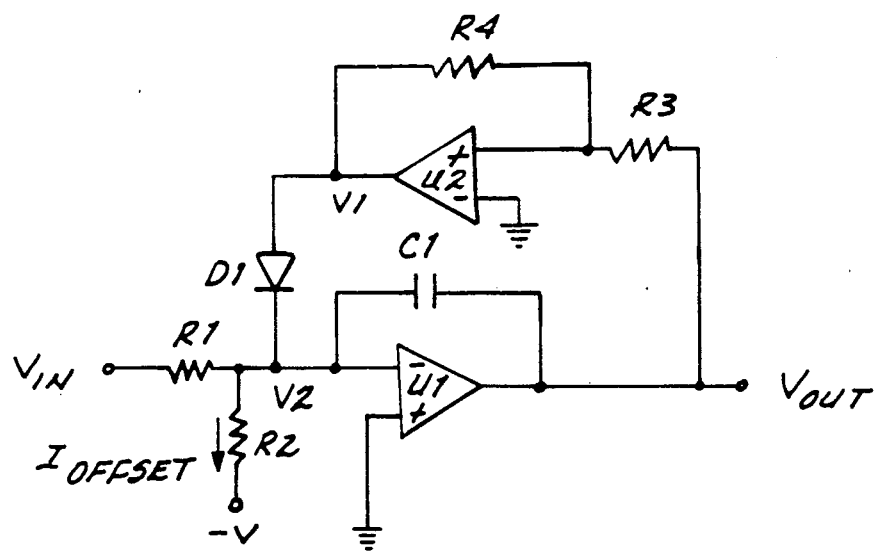
FIG. 1 is a schematic diagram of a search oscillator employing an offset current to implement sweeping.
Figure 2:
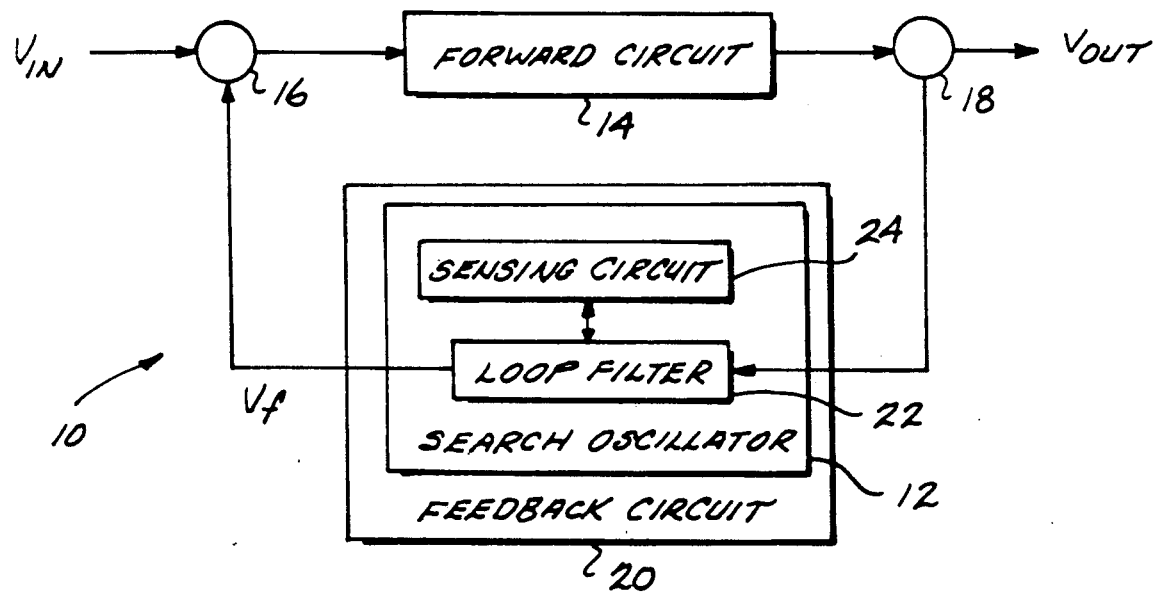
FIG. 2 is a block diagram of a feedback system including a search oscillator constructed in accordance with this invention.

Referring now to FIG. 2, a block diagram of a closed-loop system 10, including a search oscillator 12 constructed in accordance with this invention, is shown. More particularly, the system 10 receives an input $V_{in}$ that is coupled to a forward circuit 14 by a junction 16. The forward circuit 16 responds to the input signal $V_{in}$ by producing an output signal $V_{out}$ that is passed through another junction 18.

To ensure that the output signal $V_{out}$ is at the desired level, a feedback circuit 20 is incorporated into the search oscillator 12. Feedback circuit 20 receives the output signal $V_{out}$ from junction 18 and processes it to provide a feedback control signal $V_f$ to junction 16. This control signal $V_f$ effectively adjusts the input to forward circuit 14, thereby controlling the output signal $V_{out}$. As the input signal $V_{in}$ undergoes minor changes, the forward circuit 14 and feedback circuit 20 cooperatively maintain the output signal $V_{out}$ at some desired level. In certain applications, including polarization combination and phase locking, the closed-loop system 10 operating in this manner is said to be locked.

When the input signal $V_{in}$ is initially applied to system 10, or in the event that the input signal $V_{in}$ is temporarily lost, the feedback circuit 20 may be unable to bring the output signal $V_{out}$ into the desired range. In this state, the system 10 is out of lock. To pull system 10 back into lock, the search oscillator 12 included in feedback circuit 20 employs a loop filter 22 and sensing circuit 24, which cooperatively sense the out-of-lock condition and initiate a sweep operation that will adjust the feedback control signal $V_c$ to a level adequate to restore the system 10 to a locked condition.

Figure 3:
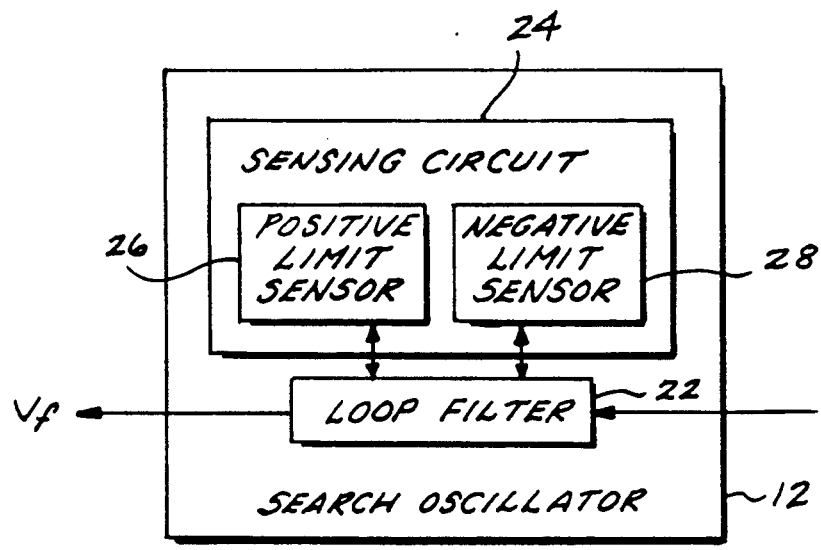
FIG. 3 is a block diagram of a search oscillator constructed in accordance with this invention.

Reviewing the construction and operation of search oscillator 12 in greater detail, reference is had to FIG. 3. As shown, the oscillator 12 includes the loop filter 22 and positive and negative limit sensors 26 and 28, which cooperatively define the sensing circuit 24. The loop filter 22 processes the feedback signal, removing unwanted components and ensuring that the desired signal level is achieved. The positive and negative limit sensors 26 and 28 monitor the output of the loop filter 22 to determine when the system is out of lock and to initiate a search or sweep function in that event.

More particularly, when the input $V_{in}$ to system 10 changes enough to cause the system 10 to fall out of lock, the output $V_f$ of loop filter 22 will rise or fall in an attempt to restore system 10 to the locked condition. The positive limit sensor 26 compares the output $V_f$ to some positive limit voltage, and resets output $V_f$ to a lower level in the event the output $V_f$ rises to that positive limit. Similarly, the negative limit sensor 28 compares output $V_f$ to a negative limit voltage and resets output $V_f$ to a higher level in the event the output $V_f$ falls to that negative limit. In either case, the output voltage $V_f$ of loop filter 22 is then free to continue rising or falling in an effort to lock the system 10.

A more detailed discussion of search oscillator 12 will now be had in connection with a particular application. Referring now to FIG. 4, a polarization diversity system 30 is shown. The polarization diversity system 30 receives and processes dual, orthogonally polarized components of an incident field, for any of a variety of purposes. For example, system 30 may be employed to accomplish signal enhancement, interference suppression, target signal analysis, adjacent channel separation, wind shear detection, or multipath reduction.

As shown in FIG. 4, the polarization diversity system 30 includes an antenna 32, adaptive polarization combiner 34, and system signal processor 36. Addressing these components individually, the antenna 32 produces input signals $V_{i1}$ and $V_{i2}$, which correspond to the orthogonal components of an arbitrarily polarized incident electric field. In most applications, the field that antenna 32 is exposed to, as well as the signals $V_{i1}$ and $V_{i2}$ produced, exhibit a frequency in the radio-frequency (RF) range of the electromagnetic spectrum. The antenna 32 is preferably of any suitable conventional design including, for example, vertical and horizontal dipoles.

The adaptive polarization combiner 34 receives the input signals $V_{i1}$ and $V_{i2}$ from antenna 32 and combines them to produce a sum output signal $V_\Sigma$ and a null output signal $V_\Delta$. Although the input signals $V_{i1}$ and $V_{i2}$ may be of arbitrary amplitude and phase, the sum output signal $V_\Sigma$ produced by the adaptive polarization combiner 34 exhibits the total power of the input signals $V_{i1}$ and $V_{i2}$ and has an optimum signal-to-noise (S/N) ratio. The combiner 34 is further relatively simple in construction, and allows components having limited operating ranges to be employed without impairing the overall operation of the combiner.

The system signal processor 36 receives the sum and null output signals $V_\Sigma$ and $V_\Delta$ to accomplish the desired objective of the polarization diversity system 30. In that regard, as suggested above, the signal processor 36 may be designed to accomplish signal enhancement, interference suppression, target signal analysis, adjacent channel separation, wind shear detection, or multipath reduction.

Discussing the adaptive polarization combiner 34 in greater detail, as shown in FIG. 4, it includes a hybrid network 38, feedback circuit 40, and an inputsensing circuit 42 or null circuit 43. Briefly, the hybrid network 38 is responsible for performing the basic combination of input signals $V_{i1}$ and $V_{i2}$ to produce the sum and null output signals $V_\Sigma$ and $V_\Delta$. The feedback circuit 40 monitors output signals $V_\Sigma$ and $V_\Delta$ to provide feedback signals $V_{c1}$ and $V_{c2}$, which are applied to the hybrid network 38 to control the manner in which the input signals $V_{i1}$ and $V_{i2}$ are combined.

The feedback circuit 40 includes a null detector 44 and level set and sensing circuit 46. The null detector 44 compares the sum and null output signals $V_\Sigma$ and $V_\Delta$ to detect changes in the relative amplitude and phase of input signals $V_{i1}$ and $V_{i2}$, corresponding to changes in the incident field polarization. As will be discussed in greater detail below, the null output signal $V_\Delta$ produced when the input signals $V_{i1}$ and $V_{i2}$ undergo an amplitude change is orthogonal to the null output signal $V_\Delta$ produced when signals $V_{i1}$ and $V_{i2}$ experience a phase change. The null detector 44 responds to these changes by producing signals $V_{n1}$ and $V_{n2}$. These signals are applied to the level set and sensing circuit 46, which produces the feedback signals $V_{c1}$ and $V_{c2}$ used by hybrid network 38 to maintain the proper operation of the adaptive polarization combiner 34.

Figure 5:
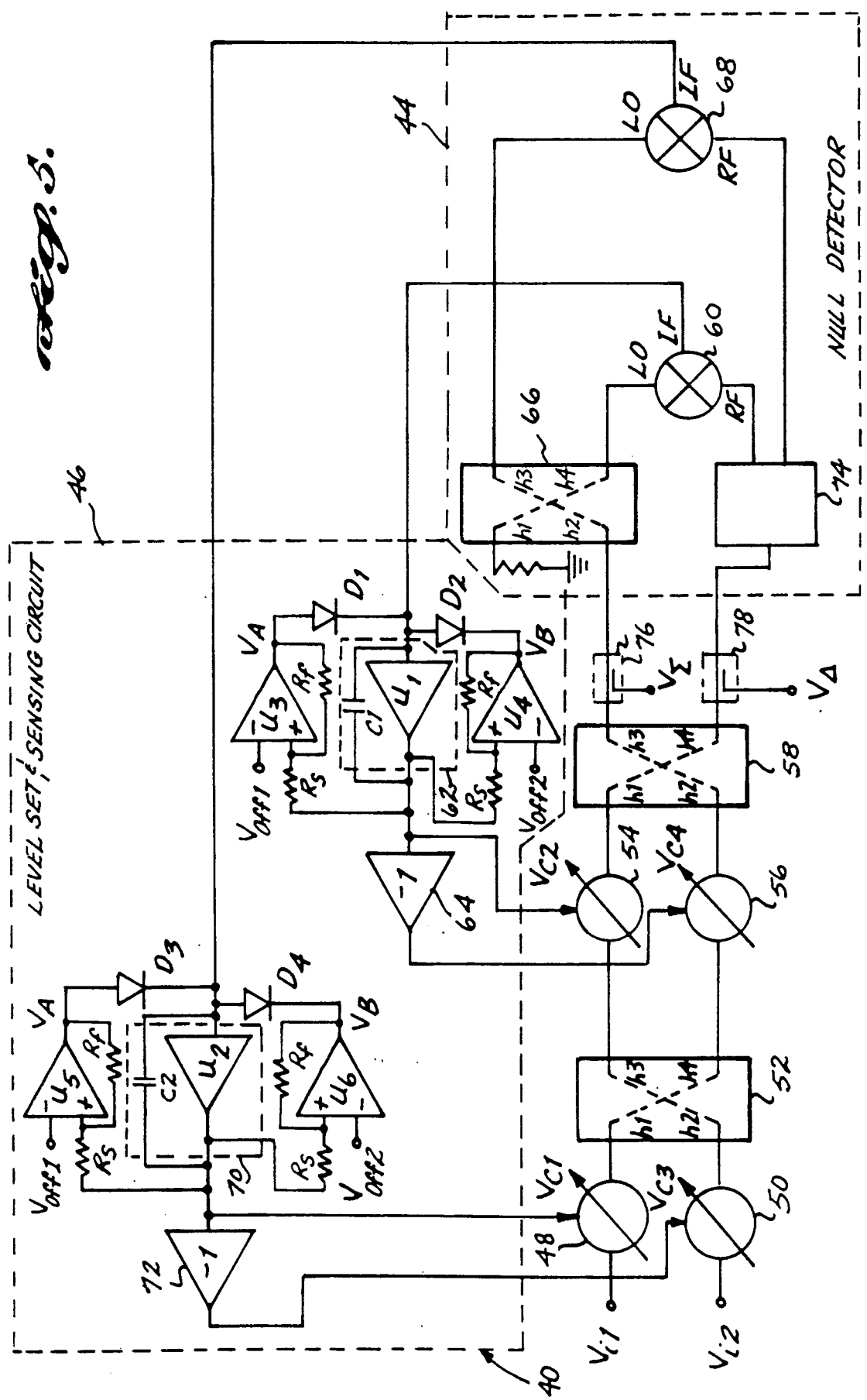
FIG. 5 is a schematic diagram of an adaptive polarization combiner included in the diversity system of FIG. 4.

Reviewing the components of the adaptive polarization combiner 34 in still greater detail, reference is had to FIG. 5. As shown, the hybrid network 38 includes a first adjustable phase shifter 48, second adjustable phase shifter 50, first 90-degree hybrid 52, third adjustable phase shifter 54, fourth adjustable phase shifter 56, and second 90-degree hybrid 58.

The first polarized input signal $V_{i1}$ is applied through the first phase shifter 48 to input port h1 of hybrid 52, while the other input signal $V_{i2}$ is applied through the second phase shifter 50 to input port h2 of hybrid 52. Phase shifter 54 connects output port h3 of hybrid 52 to input port h1 of hybrid 58 and the output port h4 of hybrid 52 is connected to the input port h2 of hybrid 58 by phase shifter 56. Finally, the sum output signal $V_\Sigma$ is produced at output port h3 of hybrid 58, while the null output signal $V_\Delta$ is produced at output port h4 of hybrid 58.

As will be discussed in greater detail below, the hybrid network 38 is controllably operated to ensure that the input signals $V_{i1}$ and $V_{i2}$ exhibit the following relationships as they are processed. As noted previously, the input signals $V_{i1}$ and $V_{i2}$ produced by antenna 32 may exhibit arbitrary amplitude and phase. Variable phase shifters 48 and 50 respond to the feedback signal $V_{c1}$ and $V_{c2}$ to ensure that the input signals $V_{i1}$ and $V_{i2}$ are in phase at the input ports h1 and h2 of hybrid 52. Hybrid 52 then produces equal amplitude signals at its output ports h3 and h4. The phase of these signals depends on the ratio of the magnitudes of input signals $V_{i1}$ and $V_{i2}$. Feedback signals $V_{c2}$ and $V_{c4}$ cause phase shifters 54 and 56 to adjust the relative phase of the signals output by hybrid 52 so that equal amplitude, orthogonal signals are provided to the input ports h1 and h2 of hybrid 58. As a result, the sum output signal $V_\Sigma$ includes the total power of the input signals $V_{i1}$ and $V_{i2}$, while the null output signal $V_\Delta$ is at a minimum.

The 90-degree hybrids 52 and 58 operate in the following manner. For the convention shown in FIG. 5, a 90-degree hybrid produces an output at port h3 that is proportional to the vector sum of the input at port h1 and the input at port h2, with the input at port h2 delayed in phase by 90 degrees. Similarly, the output produced at port h4 is proportional to the vector sum of the input at port h2 and the input at the port h1, with the input at the port h1 being delayed in phase by 90 degrees.

Before leaving the discussion of hybrid network 38, it will be helpful to consider the response of the various components of network 38 to changes in the relative amplitude or phase of the input signals $V_{i1}$ and $V_{i2}$. Taking first the situation in which the relative phase of the input signals $V_{i1}$ and $V_{i2}$ changes, the magnitude of the signal input to port h1 of hybrid 52 will remain the same but it will no longer be in phase with the signal input to port h2 of hybrid 52. As a result, the relative magnitudes of the signals at output ports h3 and h4 of hybrid 52 will be different than they previously were. However, the relative phase difference between the signals at ports h3 and h4 will not change significantly. Thus, the conditions required for producing the desired sum and null outputs $V_\Sigma$ and $V_\Delta$ are no longer maintained and, as will be appreciated, the sum output $V_\Sigma$ no longer includes the total power of the two input signals $V_{i1}$ and $V_{i2}$ and the null output $V_\Delta$ is no longer zero. Furthermore, the phase of the null output $V_\Delta$ is orthogonal to the phase of the sum output $V_\Sigma$. The sense of orthogonality ($\pm 90$ degrees) depends on the sense of the phase displacement of $V_{i1}$ relative to its initial condition.

Similarly, when the relative phase of the input signals $V_{i1}$ and $V_{i2}$ remains the same but their relative magnitudes change, input signals $V_{i1}$ and $V_{i2}$ will still be in phase at input ports h1 and h2 of hybrid 52. Because the relative magnitudes of the inputs to ports h1 and h2 of hybrid 52 have now changed, the relative phase of the outputs produced at ports h3 and h4 of hybrid 52 also changes. Although the inputs to ports h1 and h2 of hybrid 58 are equal in magnitude, they are no longer orthogonal in phase. Thus, the sum output signal $V_\Sigma$ produced at port h3 of hybrid 58 no longer includes the total power of the input signals $V_{i1}$ and $V_{i2}$ and a nonzero null output signal $V_\Delta$ is produced at output port h4 of hybrid 58. In this case, $V_\Delta$ is either in phase with $V_\Sigma$ or of opposite phase, with the phase sense depending on whether the ratio of the magnitudes of $V_{i1}$ and $V_{i2}$ increases or decreases.

Both of the preceding situations generally occur in response to changes in the polarization of the incident electric field. When the polarization combiner 14 is operating, the feedback circuit 40 uses the sum output signal $V_\Sigma$ and the nonzero null output signal $V_\Delta$ to restore the desired output conditions via feedback applied to phase shifters 48, 50, 54, and 56.

Addressing now the construction and operation of null detector 44 in greater detail, null detector 44 compares the phase of the null output or error signal $V_\Delta$ with that of the sum output signal $V_\Sigma$ to determine if and how the input signals $V_{i1}$ and $V_{i2}$ have changed in response to a change in the incident field's polarization. This information is then used to determine what adjustment, if any, to the phase shifters 48, 50, 54, and 56 is required to restore the hybrid network 38 to proper operation. In the preferred arrangement, null detector 44 includes a pair of double-balanced mixers operating in an in-phase quadrature arrangement as synchronous amplitude detectors.

More particularly, such a null detector 44 will include a synchronous amplitude detector 60, as shown in FIG. 5. As shown, detector 60 includes a radio frequency (RF) input port, a local oscillator (LO) input port, and an intermediate frequency (IF) output port. As will be discussed in greater detail below, the RF and LO signals applied to the RF and LO input ports of detector 60 have the same frequency. As a result, a DC signal is produced at the IF output port. The magnitude of this DC signal is a function of the relative phase $\phi_{LO}$ and $\phi_{RF}$ and the relative magnitude of the signals applied to the LO and RF input ports.

This DC level is zero if the signals applied to the LO and RF input ports have the same frequency and are orthogonal (90 degrees out of phase); is at a maximum positive value if the signals applied to the LO and RF input ports are in phase; and is at a maximum negative value if the signals applied to the LO and RF input ports are 180 degrees out of phase. In both latter instances, the maximum level is related to the magnitude of the RF signal ($V_\Delta$).

Addressing now the manner in which the synchronous amplitude detector 60 is employed by null detector 44, as shown in FIG. 5, the sum output signal $V_\Sigma$ from hybrid 58 is applied to the LO input port of detector 60. The null output signal $V_\Delta$ is applied to the RF input port of detector 60. As previously suggested, the sum and null output signals $V_\Sigma$ and $V_\Delta$ have the same frequency, although the null output signal $V_\Delta$ will be zero when the hybrid network 38 is properly adjusted.

The synchronous amplitude detector 60 indirectly senses those changes in the null output signal $V_\Delta$ that are due to variations in the relative phase (as opposed to relative magnitude) of the signals applied to input ports h1 and h2 of hybrid 58, and produces an output signal $V_{IF}$ in response. This output $V_{IF}$ is then integrated by an integrator 62, included as part of the loop filter 22, to produce the feedback signal $V_{c2}$ applied to phase shifter 54. The output of integrator 62 is further processed by an inverting amplifier 64 to produce the feedback signal $V_{c4}$ applied to phase shifter 56.

If a change in the incident field polarization causes the magnitude ratio of input signals $V_{i1}$ and $V_{i2}$ to decrease, the phase difference between the signals applied to input ports h1 and h2 of hybrid 58 will be greater than 90 degrees, and a nonzero null output $V_\Delta$ will be produced at terminal h4 of hybrid 58. This null output signal $V_\Delta$ has a component that is 180 degrees out of phase with the sum output signal $V_\Sigma$ present at port h3. As a result, the output $V_{IF}$ of synchronous amplitude detector 60 is at a maximum negative DC level.

In contrast, if a change in the incident field polarization causes the magnitude ratio of input signals $V_{i1}$ and $V_{i2}$ to increase, the phase difference between the signals applied to input ports h1 and h2 of hybrid 58 will be greater than 90 degrees and the null output signal $V_\Delta$ will have a component that is in phase with the sum output signal $V_\Sigma$. In this situation, synchronous amplitude detector 60 responds by producing an output $V_{IF}$ having a maximum positive DC value.

Regardless of its polarity, the output $V_{IF}$ is filtered and integrated by integrator 62 to produce the DC control voltage $V_{c2}$ applied to phase shifter 54. The inverse of the integrator's output is also produced by amplifier 64 and applied to phase shifter 56 as the DC control voltage $V_{c4}$.

This portion of the null detector 44 responds to changes in the relative phase of the signals applied to input ports h1 and h2 of hybrid 58. It does not, however, respond to changes in the relative amplitudes of these signals, as would be caused by a change in the relative phase of input signals $V_{i1}$ and $V_{i2}$. Instead, a 90-degree phase shift must be applied to the signal $V_\Sigma$ by a 90-degree phase shifter 66 included as part of a second section of null detector 44. The output of phase shifter 66 can then be applied to the LO input of a second synchronous amplitude detector 68, allowing a nonzero output $V_{IF}$ to be produced. This output $V_{IF}$ is applied to a second integrator 70 and inverting amplifier 72 to produce the control signals $V_{c1}$ and $V_{c3}$ required to control phase shifters 48 and 50. In response, phase shifters 48 and 50 restore the equality of the magnitude of the signals applied to input ports h1 and h2 of hybrid 58. As will be appreciated from the preceding remarks, synchronous amplitude detectors 60 and 68 cooperatively adjust the operation of hybrid network 38 in the event that the signals applied to input ports h1 and h2 of hybrid 58 depart from either equality of amplitude or orthogonality of phase.

In that regard, a power splitter 74 is included between port h4 of hybrid 58 and the RF ports of synchronous amplitude detectors 60 and 68. Power splitter 74 applies equal components of the null output signal $V_\Delta$ to the RF ports of both detectors 60 and 68. A third 90-degree hybrid operates as phase shifter 66 and is connected between port h3 of hybrid 58 and the LO ports of detectors 60 and 68. Hybrid 66 couples the sum output signal $V_\Sigma$ to the inputs of detectors 60 and 68, providing no phase adjustment to the signal applied to the LO port of detector 60 and a 90-degree phase adjustment to the signal applied to the LO port of detector 68.

Finally, it should be noted that a sum output sensor 76 and null output sensor 78 are included in the circuit to make the sum and null output signals $V_\Sigma$ and $V_\Delta$ available to the system processor 36. In the arrangement shown in FIG. 5, sum output sensor 76 is coupled between output port h3 of hybrid 58 and input port h2 of hybrid 66. The null output sensor 78 is, in turn, coupled between the output port h4 of hybrid 58 and the input to power splitter 74.

Returning now to a discussion of the level set and sensing circuit 46, this circuit 46 maintains the feedback control voltages $V_{c1}$, $V_{c2}$, $V_{c3}$, and $V_{c4}$ within the input range of phase shifters 48, 50, 54, and 56, regardless of changes in the relative amplitude and phase of input signals $V_{i1}$ and $V_{i2}$ caused by changes in the incident field polarization. As a result, a wider variety of phase shifters can successfully be incorporated into combiner 34, while maintaining the desired operation.

Referring to FIG. 5, the integrator 62 is represented in greater detail as including an operational amplifier $U_1$, with a capacitor $C_1$ connected between its inverting input and output terminals. Similarly, integrator 70 includes an operational amplifier $U_2$ having its output and inverting input terminals connected by a capacitor $C_2$. The sensing circuit 46 includes positive and negative limit sensors 26 and 28, made up of four comparators, four diodes, and a plurality of resistors associated with these integrators 62 and 70.

Addressing first those components associated with integrator 62, the positve limit sensor 26 includes a first comparator $U_3$ having its noninverting input connected to the output $V_{c2}$ of integrator 62 by a resistor $R_s$. The inverting input of comparator $U_3$, on the other hand, is connected to a positive offset voltage $V_{off1}$. A feedback resistor $R_f$ connects the noninverting input of comparator $U_3$ to the output of $U_3$. As will be discussed in greater detail below, the use of resistors $R_s$ and $R_f$ to provide positive feedback for the various comparators causes the comparators to operate in an hysteretic manner exhibiting separate trigger and retrace thresholds. Finally, the output of comparator $U_3$ is connected to the positive lead of a diode $D_1$, whose negative lead is connected to the input of integrator 62.

Similarly, the negative limit sensor 28 includes a second comparator $U_4$ having its noninverting input connected to the output $V_{c2}$ of integrator 62 by a resistor $R_s$. The inverting input of comparator $U_4$ is connected to a negative offset voltage $V_{off2}$. A feedback resistor $R_f$ connects the noninverting input of comparator $U_4$ to the output of $U_4$. The output of comparator $U_4$ is also connected to the negative lead of a second diode $D_2$. The positive lead of diode $D_2$ is, in turn, connected to the input to integrator 62.

Addressing the portion of the sensing circuit 42 associated with integrator 70, the positive limit sensor 26 includes a third comparator $U_5$ having its noninverting input connected to the output $V_{c1}$ of integrator 70 by a resistor $R_s$. The inverting input of comparator $U_5$ is connected to the positive offset voltage $V_{off1}$. A feedback resistor $R_f$, in turn, connects the noninverting input of comparator $U_5$ to the output of $U_5$. The output of comparator $U_5$ is connected to the positive lead of a diode $D_3$, whose negative lead is connected to the input of integrator 70.

Finally, the negative limit sensor 28 includes a fourth comparator $U_6$ also having its noninverting input connected to the output $V_{c1}$ of integrator 70 by a resistor $R_s$. The inverting input of comparator $U_6$, on the other hand, is connected to the negative offset voltage $V_{off2}$. A feedback resistor $R_f$ connects the noninverting input of comparator $U_6$ to the output of $U_6$. The output of comparator $U_6$ is also connected to the negative lead of a diode $D_4$. The positive lead of diode $D_4$ is, in turn, connected to the input of integrator 70.

Discussing now the manner in which this sensing circuit 46 operates, comparators $U_3$, $U_4$, $U_5$, and $U_6$ are used as limit sensors. Suppose that the incident polarization causes each control voltage $V_{c1}$ and $V_{c2}$ to be at the midpoint of the output range of the corresponding integrators 70 and 62. Now suppose that the incident polarization changes in a manner that causes $V_{c1}$ or $V_{c2}$ to increase or decrease. Eventually, this voltage will reach the output limit of the integrator it is produced by.

At that point, a further change in the incident polarization would not be compensated by an adjustment in the phase shifters and the combiner 34 would be unable to continue tracking the incident polarization. Comparators $U_3$, $U_4$, $U_5$, and $U_6$ sense when voltages $V_{c1}$ and $V_{c2}$ approach the maximum and minimum integrator limits and cause the voltages $V_{c1}$ and $V_{c2}$ to change by an amount corresponding to 360 degrees. As a result, the combiner 34 continues to track the changing input polarization and the voltages $V_{c1}$ and $V_{c2}$ are no longer near their maximum or minimum limit.

Discussing this in greater detail, the cooperation of comparators $U_3$ and $U_4$ and diodes $D_1$ and $D_2$ with integrator 62 will first be reviewed. FIGS. 6A, 6B, and 6C represent, respectively, the output $V_A$ of comparator $U_3$, the output $V_{c2}$ of integrator 62, and the output $V_B$ of comparator $U_4$, all related by the same time axis.

Assume, for example, that the adaptive polarization combiner 34 is operating properly and that the feedback signal $V_{c2}$ produced by integrator 62 and applied to phase shifter 54 is at zero volts (see points a and d in FIG. 6B). This zero-volt signal is connected by resistor $R_s$ to the noninverting input of $U_3$, while the input to the inverting input of $U_3$ is at the positive offset voltage $V_{off1}$. Because $V_{off1}$ is greater than zero, comparator $U_3$ will be OFF and the output $V_A$ will be low (See FIG. 6A). Hence, diode $D_1$ is back-biased and not conducting. In this situation, comparator $U_3$ has no effect on the inputs to integrator 62.

The zero-volt feedback signal $V_{c2}$ is also connected by a resistor $R_s$ to the noninverting input of comparator $U_4$. With the negative offset voltage $V_{off2}$ applied to the inverting input of $U_4$, comparator $U_4$ will be ON and its output $V_B$ high. As a result, diode $D_2$ is also back-biased and nonconducting. Thus, comparator $U_4$, like comparator $U_3$, does not influence the inputs to integrator 62.

Assume now that the incident field polarization and, hence, input signals $V_{i1}$ and $V_{i2}$ change, causing detector 60 and integrator 62 to produce an output $V_{c2}$ that goes positive from point a in FIG. 6B as the combiner 34 tracks the slewing polarization. The resistors $R_s$ and $R_f$ associated with comparator $U_3$ form a voltage divider between the positive voltage $V_{c2}$ and the low output $V_A$ of comparator $U_3$. Thus, the voltage at the noninverting input of comparator $U_3$ is equal to the output $V_{c2}$ of integrator 62, minus the voltage drop across resistor $R_s$ of the divider. The magnitude of the voltage $V_{c2}$ required to make the voltage at the noninverting input of comparator $U_3$ equal to the positive offset voltage $V_{off1}$ is referred to as $V_{th1}$ in FIG. 6B.

As will be appreciated, when $V_{c2}$ exceeds $V_{th1}$ (point b in FIG. 6B), the comparator $U_3$ will switch ON, pulling its output $V_A$ high. At this point, diode $D_1$ will be forward biased and the output $V_A$, minus the voltage drop across diode $D_1$, will be applied to the inverting input of operational amplitude $U_1$. As a result, the output $V_{c2}$ of integrator 62 will drop between points b and c of FIG. 6B.

When the output $V_{c2}$ reaches point c, it is at another threshold voltage $V_{th3}$ associated with comparator $U_3$. At this point, the voltage divider formed by resistors $R_s$ and $R_f$ between voltages $V_{c2}$ and $V_A$ will cause the voltage at the noninverting input of comparator $U_3$ to fall below the offset voltage $V_{off1}$ applied to the inverting input. As a result, comparator $U_3$ will switch back OFF, back-biasing diode $D_1$. At point c, phase shifters 54 and 56 produce a phase shift that is approximately 360 degrees from that produced when $V_{c2}$ was at point b, and the lock is maintained. However, with $V_{c2}$ and, hence, $V_{c4}$ "reset," the combiner 34 is able to continue tracking the incident polarization without exceeding the input limits of the adjustable phase shifters 54 and 56.

As previously noted, with $V_{c2}$ initially zero, comparator $U_3$ will be OFF and comparator $U_4$ will be ON. If the incident polarization then changes causing the output $V_{c2}$ of integrator 62 to decrease from point d in FIG. 6B, however, comparator $U_4$ will eventually turn OFF. This occurs at the point labeled e in FIG. 6B, where $V_{c2}$ is equal to a threshold voltage $V_{th2}$. As will be appreciated, the resistors $R_s$ and $R_f$ associated with comparator $U_4$ form a voltage divider between the high comparator output $V_B$ and the integrator output $V_{c2}$. At point e, this voltage divider provides a voltage to the noninverting input of comparator $U_4$ that is below the negative offset voltage $V_{off2}$ applied to the inverting input. As a result, comparator $U_4$ turns OFF, dropping the output $V_B$ low.

The diode $D_2$ is thus forward biased and the output $V_B$, plus the voltage drop across diode $D_2$, is applied to the inverting input of operational amplifier $U_1$. As a result, the output $V_{c2}$ of integrator 62 will rise between points e and f in FIG. 6B until a second threshold voltage $V_{th4}$, associated with comparator $U_4$, is reached. At that point, the voltage divider formed by resistors $R_s$ and $R_f$ between voltage $V_{c2}$ and the low output $V_B$, will cause the voltage at the noninverting input of comparator $U_4$ to rise back above the negative offset voltage $V_{off2}$ applied to the inverting input. As a result, comparator $U_4$ switches back ON, back-biasing diode $D_2$. At point f, phase shifters 54 and 56 produce a phase shift that is approximately 360 degrees from that produced when $V_{c2}$ was at point e, and the lock is maintained. However, with $V_{c2}$ and $V_{c4}$ "reset," the combiner 34 is able to continue tracking the incident polarization without exceeding the input limits of phase shifters 54 and 56.

By using the positive and negative offset voltages $V_{off1}$ and $V_{off2}$, the positive threshold voltage $V_{th4}$ associated with comparator $U_4$ is less than the positive threshold voltage $V_{th1}$ associated with comparator $U_3$ and the negative threshold voltage $V_{th3}$ associated with comparator $U_3$ is greater than the negative threshold voltage $V_{th2}$ associated with comparator $U_4$, as shown in FIG. 6B. Thus, the sensing circuit 46 exhibits a hysteretic operation in which retraces of the feedback voltage $V_{c2}$ initiated by comparator $U_3$ are switched "off" at a threshold $V_{th3}$ that occurs before the limit trigger $V_{th2}$ of comparator $U_4$ is reached. Similarly, retraces of the feedback voltage $V_{c2}$ initiated by comparator $U_4$ are switched off at a threshold $V_{th4}$ that occurs before the limit trigger $V_{th1}$ of comparator $U_3$ is reached.

As a result, the operation of comparator $U_3$ does not impact the operation of comparator $U_4$, and vice versa. In addition, by ensuring that this hysteretic operation encompasses a voltage range corresponding to a 360-degree phase shift between the two phase shifters, any change in incident polarization can be effectively compensated by the phase shifters. The maximum limits of the integrator and phase shifters no longer inhibit the circuit.

Turning now to a discussion of the portion of sensing circuit 46 coupled to integrator 70, as will be appreciated, its operation parallels the portion associated with integrator 62 discussed above. Thus, comparator $U_5$ controls the feedback control voltage $V_{c1}$ applied to phase shifter 48 so that it remains between thresholds $V_{th1}$ and $V_{th3}$ as the combiner 34 tracks slewing polarizations that cause $V_{c1}$ to rise. Comparator $U_6$, on the other hand, limits the feedback control voltage $V_{c1}$ to a range extending between $V_{th2}$ and $V_{th4}$ as the combiner 34 tracks slewing polarizations that cause $V_{c1}$ to fall.

Figure 7:
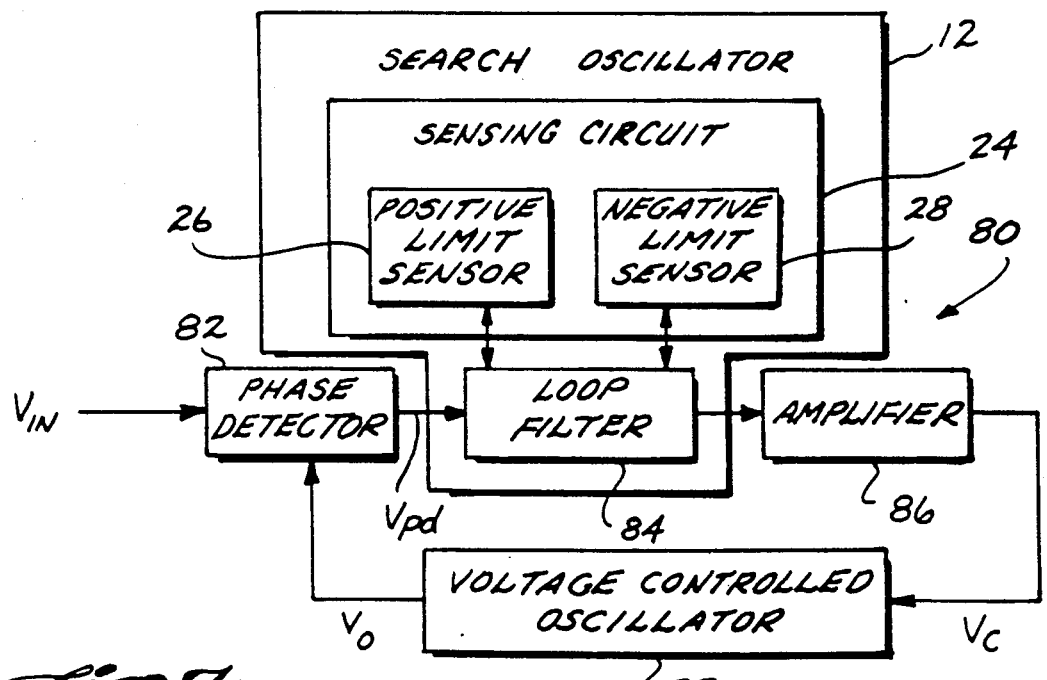
FIG. 7 is a block diagram of the search oscillator of FIG. 3 included in a phase-locked loop.

Turning now to a second application for search oscillator 12, reference is had to FIG. 7. There, a phase-locked loop (PLL) 80, incorporating a search oscillator 12, is shown. PLL 80 also includes a phase detector 82, loop filter 84, amplifier 86, and voltage-controlled oscillator (VCO) 88. The PLL 80 can be used as a tuned amplifier, FM demodulator, frequency synthesizer, tone detector, or a PM detector.

This closed-loop system receives an input signal $V_{in}$, applied to phase detector 82. When the PLL 80 is locked onto the input signal $V_{in}$, the output signal $V_o$ produced by VCO 88 will have the same frequency as $V_{in}$. If the frequency of input signal $V_{in}$ shifts slightly, the phase difference between the input signal $V_{in}$ and the output $V_o$ of VCO 88 will begin to increase.

The phase detector 82 responds to this phase difference by producing a DC output $V_{pd}$ that is proportional to the phase difference. The DC signal $V_{pd}$ is then low-pass filtered and amplified at blocks 84 and 86 to produce a control signal $V_c$ processed by VCO 88 and applied as an output to phase detector 82. In this manner, the PLL 80 is able to maintain lock when the frequency of the input $V_{in}$ changes. In addition, the magnitude of the signal $V_c$ applied to the VCO 88 will be proportional to the frequency of the input signal $V_{in}$.

As will appreciated, if the frequency of the input signal $V_{i1}$ changes too much, the PLL 80 may no longer be able to maintain the lock and will initiate the pull-in, or capture, process. In that regard, search oscillator 12 is included to sweep the input and output of VCO 88 through a range of levels to enhance the pull-in capabilities of PLL 80.

More particularly, as will be appreciated from the discussion of search oscillator 12 provided in connection with polarization diversity system 30, the positive and negative limit sensors 26 and 28 of oscillator 12 monitor and control the output of loop filter 84. When the PLL 80 is out of lock and the output of loop filter 84 is slewing positive, the positive limit sensor 26 is responsible for resetting the output to ensure that it continues to sweep positively over the positive hysteretic range until lock is achieved. Similarly, if the output of loop filter 84 is slewing negative, the negative limit sensor 28 is responsible for resetting the output to ensure that it continues to sweep negatively over the negative hysteretic range until lock is achieved.

In either event, the operation of the search oscillator 12 is basically the same as that discussed above in connection with FIGS. 5 and 6. As a result, the pull-in capability of the PLL 80 is improved, allowing either polarity sweep to be accommodated without undue complexity. Further, the need for an independent offset current $I_{offset}$ is avoided by using the loop filter's inherent offset to slowly charge the filter capacitor.

Those skilled in the art will recognize that the embodiments of the invention disclosed herein are exemplary in nature and that various changes can be made therein without departing from the scope and the spirit of the invention. In that regard, and as was previously mentioned, the search oscillator is readily employed in a variety of different closed-loop systems, including adaptive polarization combiners and phase-locked loops. Because of the above and numerous other variations and modifications that will occur to those skilled in the art, the following claims should not be limited to the embodiments illustrated and discussed herein.

The embodiments of the invention in which an exclusive property or privilege is claimed are defined as follows:

1. A search oscillator for receiving an input signal and producing an output signal, said search oscillator comprising:
    filter means for filtering said input signal to produce said output signal;
    positive limit-sensing means for monitoring said output signal and providing a first output to said filter means to adjust said output signal to a first reset level if said output signal rises above some first threshold level; and
    negative limit-sensing means for monitoring said output signal and providing a second output to said filter means to adjust said output signal to a second reset level if said output signal falls below some second threshold level.

2. The search oscillator of claim 1, wherein said first threshold level is greater than said second reset level and wherein said second threshold level is less than said first reset level, said search oscillator being operable in a hysteretic manner.

3. The search oscillator of claim 1, wherein said filter means comprises:
    a first operational amplifier having an inverting input for receiving said input signal, a noninverting input, and an output for providing an output signal; and
    a capacitor, having a first lead connected to said inverting input of said first operational amplifier and a second lead connected to said output of said first operational amplifier.

4. The search oscillator of claim 3, wherein said positive limitsensing means comprises:

a first comparator, having an inverting input for receiving a first offset signal, a noninverting input connected to said output of said first operational amplifier, and an output; and
    a first diode, having a first lead connected to said output of said first comparator and a second lead connected to said inverting input of said first operational amplifier.

5. The search oscillator of claim 4, wherein said negative limit-sensing means comprises:
    a second comparator, having an inverting input for receiving a second offset signal, a noninverting input connected to said output of said first operational amplifier, and an output; and
    a second diode, having a first lead connected to said output of said second comparator and a second lead connected to said inverting input of said first operational amplifier.

6. The search oscillator of claim 1, wherein said positive and negative limit-sensing means are further for cooperatively allowing said output signal to be swept over a predetermined range without adjustment.

7. The search oscillator of claim 6, wherein said search oscillator is operable in a locked condition and an unlocked condition and wherein said positive and negative limit-sensing means cooperatively sweep said output signal over said predetermined range when said search oscillator is in the unlocked condition and isolate themselves from said first operational amplifier and said capacitor when said search oscillator is in the locked condition.

8. The search oscillator of claim 1, wherein said filter means is for sweeping said output signal without the aid of external offset current.

9. A method of producing an output signal in response to an input signal comprising the steps of:
    filtering the input signal to produce the output signal;
    monitoring the output signal;
    adjusting the output signal to a first reset level if the output signal rises above some first threshold level; and
    adjusting the output signal to a second reset level if the output signal falls below some second threshold level.

10. The method of claim 9, wherein the first threshold level is greater than the second reset level and wherein the second threshold level is less than the first reset level, the output being produced in a hysteretic manner.

11. The method of claim 9, wherein said steps of monitoring and adjusting the output signal cooperatively allow the output signal to be swept over a predetermined range without adjustment.

12. The method of claim 11, wherein said output may be in a locked condition or an unlocked condition and wherein said steps of monitoring and adjusting the output signal cooperatively sweep the output signal over a predetermined range only during the unlocked condition.

* * * * *